(12) United States Patent
Zhu et al.

(10) Patent No.: US 11,132,974 B2
(45) Date of Patent: Sep. 28, 2021

(54) DATA TRANSMISSION CIRCUIT, DISPLAY DEVICE AND DATA TRANSMISSION METHOD

(71) Applicant: BOE TECHNOLOGY GROUP CO., LTD., Beijing (CN)

(72) Inventors: Xuehui Zhu, Beijing (CN); Junrui Zhang, Beijing (CN); Ronghua Lan, Beijing (CN); Zongze He, Beijing (CN); Yehao Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 8 days.

(21) Appl. No.: 16/828,464

(22) Filed: Mar. 24, 2020

(65) Prior Publication Data
US 2021/0158774 A1 May 27, 2021

(30) Foreign Application Priority Data
Nov. 27, 2019 (CN) .......................... 201911189318.8

(51) Int. Cl.
| | |
|---|---|
| *G11C 19/00* | (2006.01) |
| *G09G 5/00* | (2006.01) |
| *H03M 9/00* | (2006.01) |
| *G11C 19/28* | (2006.01) |
| *H03K 23/54* | (2006.01) |

(52) U.S. Cl.
CPC .............. *G09G 5/006* (2013.01); *G11C 19/00* (2013.01); *G11C 19/28* (2013.01); *G11C 19/287* (2013.01); *H03M 9/00* (2013.01); *G09G 2310/0286* (2013.01); *G09G 2370/08* (2013.01); *H03K 23/54* (2013.01)

(58) Field of Classification Search
None
See application file for complete search history.

(56) References Cited

U.S. PATENT DOCUMENTS 6,628,214 B1 * 9/2003 Kawase ................. G09G 5/006
341/100
6,831,633 B1 * 12/2004 Murade ................ G09G 3/3677
345/204

(Continued)

*Primary Examiner* — Tuan T Lam
(74) *Attorney, Agent, or Firm* — Dave Law Group LLC; Raj S. Dave

(57) ABSTRACT

The embodiments of the present disclosure provide a data transmission circuit, a display device and a data transmission method. The data transmission circuit includes a serial-to-parallel conversion circuit configured to receive serial data and a mode setting signal, generate a mode selection signal according to the mode setting signal, and convert the serial data into parallel data with a corresponding bit width according to the mode selection signal; a control signal generating circuit configured to generate a control signal based on the mode setting signal; and a latch circuit connected to the serial-to-parallel conversion circuit and the control signal generating circuit, and being configured to receive the parallel data from the serial-to-parallel conversion circuit and the control signal from the control signal generating circuit, and latch and output the received parallel data under the control of the control signal.

15 Claims, 10 Drawing Sheets

(56) References Cited

U.S. PATENT DOCUMENTS

| | | | | |
|---|---|---|---|---|
| 7,310,057 | B2* | 12/2007 | Murata | H03M 9/00 341/101 |
| 8,866,799 | B2* | 10/2014 | Jun | G09G 3/36 345/204 |
| 9,041,640 | B2* | 5/2015 | Seo | G09G 3/3688 345/100 |
| 9,390,680 | B2* | 7/2016 | Jeon | G09G 3/3696 |
| 2004/0222826 | A1* | 11/2004 | Takeuchi | H03M 9/00 327/123 |
| 2006/0268624 | A1* | 11/2006 | Jang | G11C 29/32 365/189.011 |
| 2008/0218389 | A1* | 9/2008 | Yamagata | H03M 9/00 341/100 |
| 2010/0321413 | A1* | 12/2010 | Weng | G09G 3/3688 345/690 |
| 2011/0199397 | A1* | 8/2011 | Ko | G09G 3/3688 345/690 |

\* cited by examiner

DATA TRANSMISSION CIRCUIT, DISPLAY DEVICE AND DATA TRANSMISSION METHOD

CROSS-REFERENCE TO RELATED APPLICATIONS

The present application claims the benefit of priority right of Chinese patent application with the application No. of 201911189318.8, filed on Nov. 27, 2019, which is incorporated by reference herein in its entirety as part of the present application.

TECHNICAL FIELD

The embodiments of the present disclosure relate to a technical field of data transmission, in particular, relate to a data transmission circuit, a display device and a data transmission method.

BACKGROUND

In general, data transmission circuits are widely used in various fields. For example, in a display device, a data transmission circuit is usually used to convert serial display data to parallel data and transfer the parallel data to a pixel array on a display panel to drive the pixel array for display. Different transmission modes can be used to transmit data. For example, data is usually transmitted in a 1-bit mode, a 3-bit mode, or a 4-bit mode in display technology field. In order to support different transmission modes, a dedicated control path needs to be set for each mode in traditional technology, which increases the complexity of the data transmission circuit.

SUMMARY

According to one aspect of the present disclosure, there is provided a data transmission circuit, comprising: a serial-to-parallel conversion circuit configured to receive serial data and a mode setting signal, generate a mode selection signal according to the mode setting signal, and convert the serial data into parallel data with a corresponding bit width according to the mode selection signal; a control signal generating circuit configured to generate a control signal based on the mode setting signal; and a latch circuit connected to the serial-to-parallel conversion circuit and the control signal generating circuit, and being configured to receive the parallel data from the serial-to-parallel conversion circuit and the control signal from the control signal generating circuit, and latch and output the received parallel data under the control of the control signal.

According to some embodiments of the present disclosure, the serial-to-parallel conversion circuit is further configured to generate a plurality of mode signals respectively for a plurality of modes, wherein the mode signals are used to generate the control signal.

According to some embodiments of the present disclosure, the control signal generating circuit comprises: a mode selection circuit connected to the serial-to-parallel conversion circuit and being configured to select one from the plurality of mode signals based on the mode setting signal; and a control circuit connected to the mode selection circuit and being configured to convert the selected mode signal into the control signal.

According to some embodiments of the present disclosure, the plurality of modes comprise a first mode and a second mode, and the plurality of mode signals comprise a first mode signal for the first mode and a second mode signal for the second mode, the serial-to-parallel conversion circuit is configured to set the first mode to be a data transmission mode according to the mode setting signal, and convert the serial data into parallel data with a first bit width; or set the second mode to be a data transmission mode according to the mode setting signal, and convert the serial data into parallel data with a second bit width, wherein the first bit width corresponds to the first mode, the second bit width corresponds to the second mode, and the first bit width is different from the second bit width.

According to some embodiments of the present disclosure, the serial-to-parallel conversion circuit comprises: N stages of cascaded shift register sub-circuits, wherein each stage of shift register sub-circuit is configured to generate a sampling clock signal and output a corresponding bit in the serial data based on the generated sampling clock signal, wherein the sampling clock signal generated by the shift register sub-circuit at n-th stage is shifted relative to the sampling clock signal generated by the shift register sub-circuit at (n−1)-th stage, wherein n and N are positive integers, and 1<n≤N; a first selector configured to select one of an enable signal and a sampling clock signal from the shift register sub-circuit at N-th stage under the control of the mode selection signal to trigger the shift register sub-circuit at first stage to generate a sampling clock signal; a second selector configured to select one of a sampling clock signal from the shift register sub-circuit at i-th stage and a sampling clock signal from the shift register sub-circuit at N-th stage under the control of the mode selection signal to trigger the shift register sub-circuit at (i+1)-th stage to generate a sampling clock signal, wherein i is an integer and 1<i<N; a mode selection signal generating sub-circuit configured to generate the mode selection signal according to the mode setting signal and one of sampling clock signals generated by the N stages of cascaded shift register sub-circuits; and a mode signal generating sub-circuit configured to generate the plurality of mode signals based on at least a part of the sampling clock signals generated by the N stages of cascaded shift register sub-circuits.

According to some embodiments of the present disclosure, each stage of the shift register sub-circuits comprises: a sampling clock generator having an input terminal for receiving a clock signal, and being configured to sample the clock signal at the input terminal of the sampling clock generator to produce a sampling clock signal according to a signal at the control terminal of the sampling clock generator and output the sampling clock signal at an output terminal of the sampling clock generator; and a D latch having an input terminal for receiving the serial data, an control terminal connected to the output terminal of the sampling clock generator, and an output terminal serving as one of the N output terminals of the serial-parallel conversion circuit, wherein the control terminal of the sampling clock generator of the shift register sub-circuit at n-th stage is connected to the output terminal of the sampling clock generator of the shift register sub-circuit at (n−1)-th stage, and the control terminal of the sampling clock generator of the shift register sub-circuit at first stage is connected to the output terminal of the first selector, and the control terminal of the sampling clock generator of the shift register sub-circuit at i-th stage is connected to the output terminal of the second selector.

According to some embodiments of the present disclosure, the mode signal generating sub-circuit comprises: a first mode signal generating sub-circuit configured to output a first mode signal comprising a first sub-signal and a second sub-signal based on at least a part of the sampling clock signals generated by the N stages of cascaded shift register sub-circuits; and a second mode signal generating sub-circuit configured to output a second mode signal comprising a first sub-signal and a second sub-signal based on at least a part of the sampling clock signals generated by the N stages of cascaded shift register sub-circuits.

According to some embodiments of the present disclosure, N=8 and i=2, the first mode signal generating sub-circuit comprises: a first SR latch, wherein a set terminal of the first SR latch receives a sampling clock signal generated by the shift register sub-circuit at fifth stage, a reset terminal of the first SR latch receives a sampling clock signal generated by the shift register sub-circuit at seventh stage, an output terminal of the first SR latch outputs the first sub-signal of the first mode signal; and a second SR latch, wherein a set terminal of the second SR latch receives a sampling clock signal generated by the shift register sub-circuit at eighth stage, a reset terminal of the second SR latch receives a sampling clock signal generated by the shift register sub-circuit at fourth stage, an output terminal of the second SR latch outputs the second sub-signal of the first mode signal, and the second mode signal generating sub-circuit comprises: a third SR latch, wherein a set terminal of the third SR latch receives the sampling clock signal generated by the shift register sub-circuit at fourth stage, a reset terminal of the third SR latch receives a sampling clock signal generated by the shift register sub-circuit at sixth stage, an output terminal of the third SR latch outputs the first sub-signal of the second mode signal; and a fourth SR latch, wherein a set terminal of the fourth SR latch receives the sampling clock signal generated by the shift register sub-circuit at eighth stage, and a reset terminal of the fourth SR latch receives a sampling clock signal generated by the shift register sub-circuit at second stage, an output terminal of the fourth SR latch outputs the second sub-signal of the second mode signal.

According to some embodiments of the present disclosure, the mode selection circuit comprises a third selector, a first input terminal of the third selector receives the first mode signal, and a second input terminal of the third selector receives the second mode signal, a control terminal of the third selector receives the mode setting signal, and an output terminal of the third selector is connected to the control circuit.

According to some embodiments of the present disclosure, the control circuit comprises: a ring counter having an input terminal connected to the mode selection circuit to receive the selected mode signal; and a switch array having an input terminal connected to the mode selection circuit to receive the selected mode signal, a control terminal connected to the output terminal of the ring counter, and an output terminal configured to output the control signal.

According to some embodiments of the present disclosure, the latch circuit comprises a plurality of latch units arranged in an array, wherein each of latch units is connected to one of N output terminals of the serial-to-parallel conversion circuit, and is configured to latch and output the signal at one of the plurality of output terminals under the control of the control signal, where N is an integer greater than 1.

According to some embodiments of the present disclosure, there is further provided a display device comprising the data transmission circuit discussed above.

According to some embodiments of the present disclosure, there is further provided a data transmission method for the data transmission circuit discussed above, comprising: receiving serial data and a mode setting signal, generating a mode selection signal according to the mode setting signal, and converting the serial data into parallel data with a corresponding bit width according to the mode selection signal; generating a control signal based on the mode setting signal; and receiving the parallel data and the control signal, and outputting the received parallel data under the control of the control signal.

According to some embodiments of the present disclosure, the data transmission method further comprises: generating a plurality of mode signals respectively for a plurality of modes, wherein the mode signals are used to generate the control signal.

According to some embodiments of the present disclosure, the generating a control signal based on the mode setting signal comprises: selecting one from the plurality of mode signals based on the mode setting signal; converting the selected mode signal into the control signal.

BRIEF DESCRIPTION OF THE DRAWINGS

The drawings herein are incorporated in and constitute a part of the specification, illustrate the embodiments consistent with the present disclosure, are used to explain the principles of the present disclosure together with the specification and provide a further understanding of the present disclosure, and do not constitute a limitation on the present disclosure. The above and other objectives, features, and advantages of the present disclosure will become more apparent by describing the embodiments of the present disclosure in more detail with reference to the drawings. In the drawings, the same reference numbers generally represent the same components or steps.

DETAILED DESCRIPTION

Figure 1:
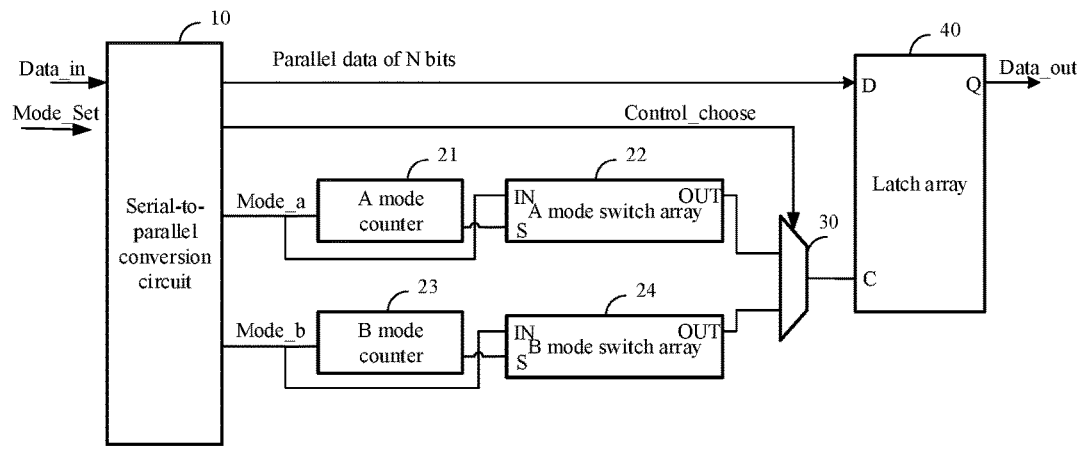
FIG. 1 illustrates a block diagram of a data transmission circuit.

In the following, the present disclosure will be fully described with reference to the drawings containing preferred embodiments of the present disclosure, which will make the objectives, technical solutions, and advantages of the embodiments of the present disclosure more clear. Obviously, the described embodiments are a part of the disclosure, but not all of the disclosure. Based on the described embodiments of the present disclosure, all other embodiments obtained by those skilled in the art without paying creative labor belong to the scope of protection of the present disclosure. It should be noted that throughout the drawings, the same elements are represented by the same or similar reference numbers. In the following description, some specific embodiments are used for descriptive purposes only and should not be construed as any limitation to the present disclosure, but merely as examples of the embodiments of the present disclosure. Conventional structures or configurations will be omitted when it may cause confusion in the understanding of the present disclosure. It should be noted that the shapes and sizes of the components in the figures do not reflect the true size and proportion, but merely illustrate the content of the embodiments of the present disclosure.

Unless otherwise defined, the technical terms or scientific terms used in the embodiments of the present disclosure shall have ordinary meanings as understood by those skilled in the art. The terms "first", "second", and the like used in the embodiments of the present disclosure do not indicate any order, quantity, or importance, but are only used to distinguish different components.

In addition, in the description of the embodiments of the present disclosure, the terms "connected" or "connected to" may mean that two components are directly connected, or that two components are connected via one or more other components. In addition, these two components may be connected or coupled by wired or wireless means.

In the following, several data transmission modes are introduced by taking the data transmission in display field as an example.

In a 1-bit mode, the order of input data to the sub-pixels on the display panel is R, G, B, R, G, B, but the data for each color sub-pixel in the input data is copied three times, that is, RRR, GGG, BBB, where R represents data for red sub-pixels, G represents data for green sub-pixels, and B represents data for blue sub-pixels. This makes the effective data received by each sub-pixel actually be 1 bit, that is, the data received by each sub-pixel is either 000 or 111, so that the display picture is a black and white picture.

In a 3-bit mode, the display data is transmitted to the sub-pixels on the display panel in RGB and RGB modes, so that each sub-pixel receives 3 bits of effective data, that is, RGB.

In a 4-bit mode, the data contains Dummy values, and the input data is set to RGB(Dummy) and RGB(Dummy). Due to the dummy value between the RGB data input to the two sub-pixels, it is necessary to input 4 bits of data in order to provide 3 bits of effective data (i.e. RGB data) to the sub-pixels FIG. 1 shows a block diagram of a data transmission circuit.

As shown in FIG. 1, the data transmission circuit comprises a serial-to-parallel conversion circuit 10, a first control path including an A-mode counter 21 and an A-mode switch array 22, a second control path including a B-mode counter 21 and a B-mode switch array 22, a selector 30 and a latch array 40. The serial-parallel conversion circuit 10 converts, for example, serial data Data_in into parallel data of N bits under the control of the mode setting signal Mode_set, and generates mode signals for different modes, such as a mode signal Mode_a for the A-mode and a mode signal Mode_b for the B-mode. The first control path converts the mode signal Mode_a into a control signal for the A-mode, and the second control path converts the mode signal Mode_b into a control signal for the B-mode. The selector 30 selects one from the control signal for A-mode and the control signal for B-mode according to the selection signal Control_choose provided by the serial-parallel conversion circuit 10, and provides the same to the control terminal C of the latch array 40. The input terminal D of the latch array 40 receives the parallel data of N bits generated by the serial-to-parallel conversion circuit 10 and latch the parallel data of N bits under the control of the control terminal C and output the latched data at the output terminal Q. Generally, N is 8, that is, an 8-bit parallel signal is output.

The serial-to-parallel conversion circuit 10 does not distinguish the data mode. No matter which mode of serial data Data_in is received, the serial-to-parallel conversion circuit 10 adopts a manner of constituting one cycle by N bits data (i.e. one-cycle having N bits) to convert the received serial data into parallel data of N bits. This results in different amounts of effective data contained in the parallel data output per cycle in different modes. For example, taking N=8 as an example, the parallel data of 8 bits output by the serial-parallel conversion circuit 10 in the 3-bit mode contains 8 bits effective data, and the parallel data of 8 bits output by the serial-parallel conversion circuit 10 in the 4-bit mode contains only 6 bits effective data because 2 bits data are used to transmit the dummy values.

For this reason, it is necessary to provide a separate control path for each mode to control the latch array 40 to output the same amount of effective data each time. For example, in FIG. 1, it is assumed that N=8, A-mode is the 3-bit mode, and B-mode is the 4-bit mode. The first control path generates a control signal for the 3-bit mode, and the second control path generates a control signal for the 4-bit mode.

In the 3-bit mode, the parallel data of 8 bits generated by the serial-parallel conversion circuit 10 is supplied to the latch array 40. The selector 30 selects a control signal for the 3-bit mode and supplies it to the latch array 40. Under the control of the control signal, the required 8 bits effective data are selected from the parallel data of 8 bits for latching and output.

In the 4-bit mode, the parallel data of 8 bits generated by the serial-to-parallel conversion circuit 10 is provided to the latch array 40. The selector 30 selects a control signal for the 4-bit mode and supplies it to the latch array 40. Under the control of the control signal, the required 6 bits effective data is selected from the parallel data of 8 bits for latching and output.

In the data transmission circuit of FIG. 1, since the serial-to-parallel conversion circuit 10 does not distinguish data transmission modes, a separate control path needs to be set for each mode, which increases the complexity of circuit design.

Figure 2A:
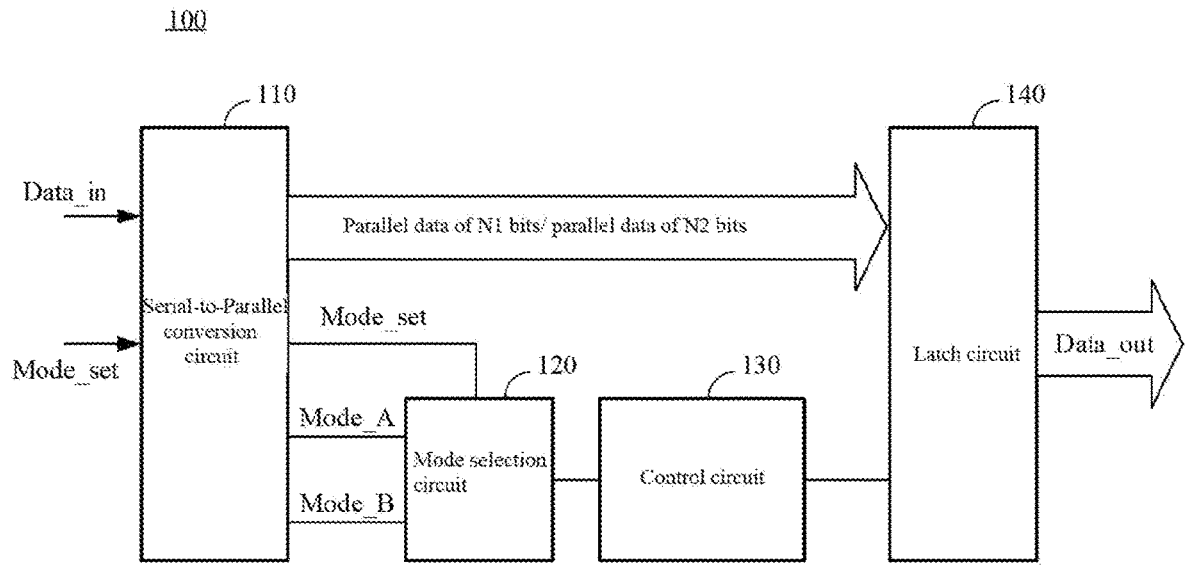
FIG. 2A illustrates a schematic block diagram of a data transmission circuit according to the embodiments of the present disclosure.

The present disclosure provides a data transmission circuit for generating a mode selection signal according to a mode setting signal, converting serial data into parallel data with a corresponding bit width based on the mode selection signal, latching and output the received data under the control of a control signal. FIG. 2A illustrates a schematic block diagram of a data transmission circuit according to the embodiments of the present disclosure. As shown in FIG. 2A, a data transmission circuit according to the embodiments of the present disclosure comprises a serial-to-parallel conversion circuit 50, a control signal generating circuit 60, and a latch circuit 70.

The serial-parallel conversion circuit 50 is configured to receive serial data Data_in and a mode setting signal Mode_set, generate a mode selection signal Mode_choose according to the mode setting signal Mode_set, and convert the serial data Data_in into parallel data with a corresponding bit width according to the mode selection signal Mode_choose. The control signal generating circuit 60 is configured to generate a control signal based on the mode setting signal Mode_set. The latch circuit 70 is connected to the serial-to-parallel conversion circuit 50 and the control signal generating circuit 60, and is configured to receive the parallel data from the serial-to-parallel conversion circuit 50 and the control signal from the control signal generating circuit 60, and latch and output the received parallel data under the control of the control signal.

According to some embodiments of the present disclosure, the serial-to-parallel conversion circuit 50 is further configured to generate a plurality of mode signals respectively for a plurality of modes, wherein the mode signal is used to generate the control signal. According to some embodiments of the present disclosure, the control signal generating circuit 60 may comprise a mode selection circuit and a control circuit. The mode selection circuit is connected to the serial-parallel conversion circuit and is configured to select one mode signal from the plurality of mode signals based on the mode setting signal Mode_set. The control circuit is connected to the mode selection circuit and is configured to convert the selected mode signal into the control signal.

Figure 2B:
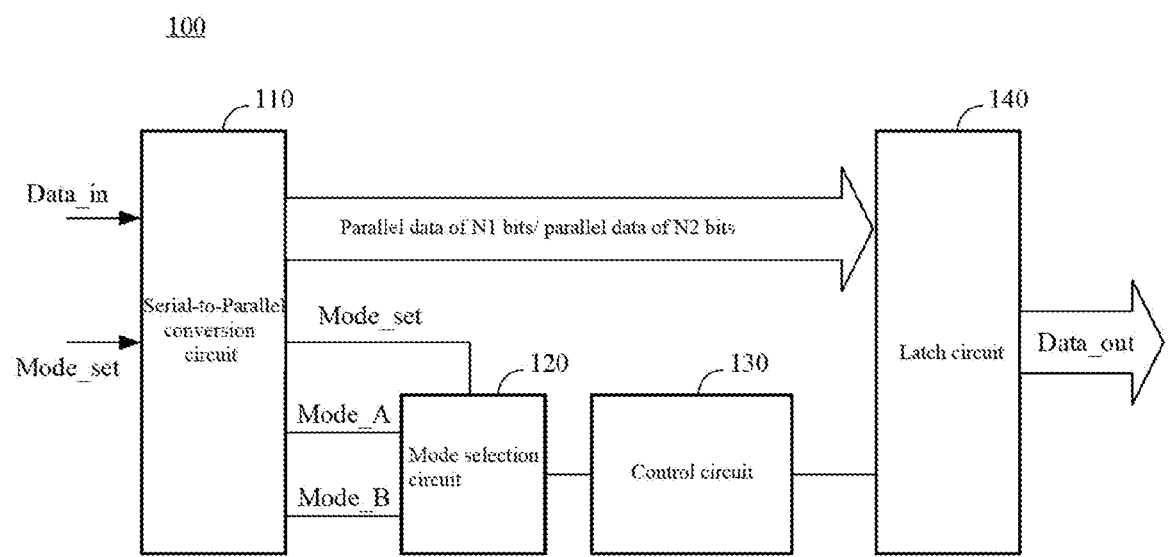
FIG. 2B illustrates a schematic diagram of a data transmission circuit according to the embodiments of the present disclosure.

FIG. 2B illustrates a circuit diagram of a data transmission circuit 100 according to the embodiments of the present disclosure. The circuit structure of the data transmission circuit 100 and the functions of each circuit module according to the present disclosure will be described in detail below with reference to FIG. 2B.

As shown in FIG. 2B, the data transmission circuit 100 comprises a serial-to-parallel conversion circuit 110, a mode selection circuit 120, a control circuit 130, and a latch circuit 140. The mode selection circuit 120 and the control circuit 130 constitute the control signal generating circuit 60 as described above, and are used to generate the control signal.

The serial-to-parallel conversion circuit 110 receives serial data Data_in and a mode setting signal Mode_set, and generates a plurality of mode signals respectively for a plurality of modes. For example, the plurality of modes in FIG. 1 comprise a first mode (such as A-mode) and a second mode (such as B-mode). The multiple mode signals comprise a first mode signal Mode_A for the first mode and a second mode signal Mode_B for the second mode. The serial-parallel conversion circuit 110 may generate a mode selection signal Mode_choose according to the mode setting signal Mode_set, and convert the serial data Data_in into parallel data with a corresponding bit width according to the mode selection signal Mode_choose. For example, the serial-to-parallel conversion circuit 110 may set the first mode as the data transmission mode according to the mode selection signal Mode_choose, and convert the serial data Data_in into parallel data with a first bit width (such as N1 bits), or may set the second mode as the data transmission mode according to the mode selection signal Mode_choose, and convert the serial data Data_in into parallel data with a second bit width (such as N2 bits).

The mode selection circuit 120 is connected to the serial-parallel conversion circuit 110 to receive the first mode signal Mode_A, the second mode signal Mode_B, and the mode setting signal Mode_set. The mode selection circuit 120 may select one mode signal from the plurality of mode signals (for example, the first mode signal Mode_A and the second mode signal Mode_B) according to the mode setting signal Mode_set and provide the selected mode signal to the control circuit 130. For example, the mode selection circuit 120 may comprise a selector (a third selector). The first input terminal of the selector receives the first mode signal Mode_A, the second input terminal of the selector receives the second mode signal Mode_B, and the control terminal of the selector receives the mode setting signal Mode_set, and the output terminal of the selector is connected to the input terminal of the control circuit 130.

The output terminal of the control circuit 130 is connected to the latch circuit 140. The control circuit 130 may receive the mode signal selected by the mode selection circuit 120, convert the mode signal into a control signal, and provide it to the latch circuit 140.

The latch circuit 140 is connected to the serial-to-parallel conversion circuit 110 and the control circuit 130. The latch circuit 140 may receive parallel data (such as parallel data of N1 bits or parallel data of N2 bits) from the serial-to-parallel conversion circuit 120 and the control signal from the control circuit 130, and latch and output the received parallel data under the control of the control signal, so as to provide the output data Data_out. The output data Data_out may be provided to the sub-pixels on the display panel, thereby being used to drive the sub-pixels for display.

Figure 3A:
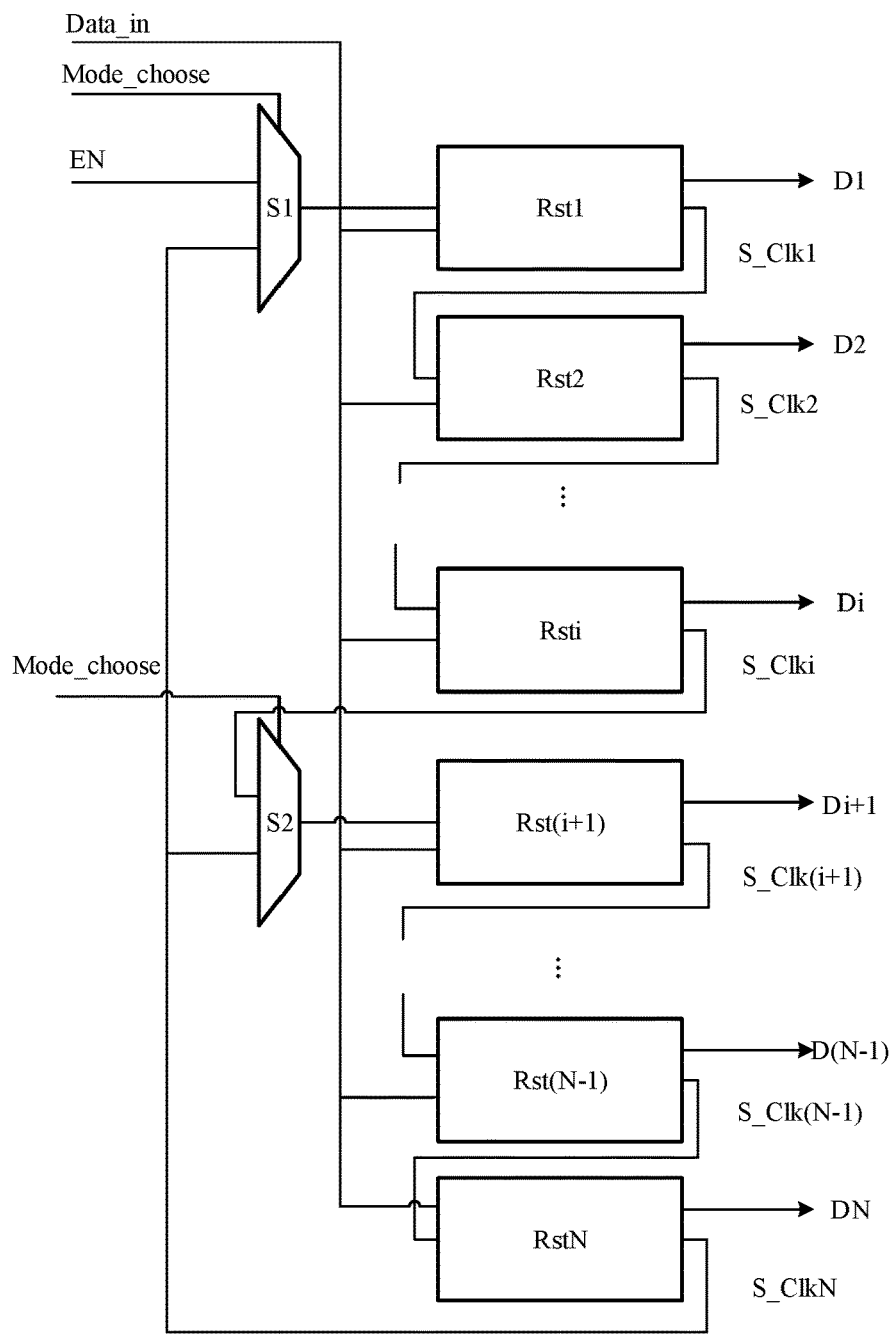
FIG. 3A, FIG. 3B, and FIG. 3C illustrate block diagrams of a serial-to-parallel conversion circuit of a data transmission circuit according to some embodiments of the present disclosure.
Figure 3B:
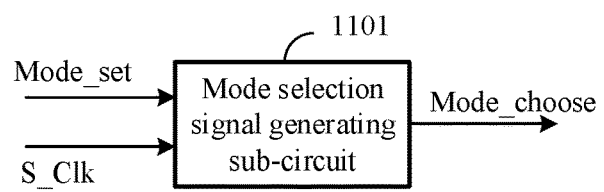
Figure 3C:
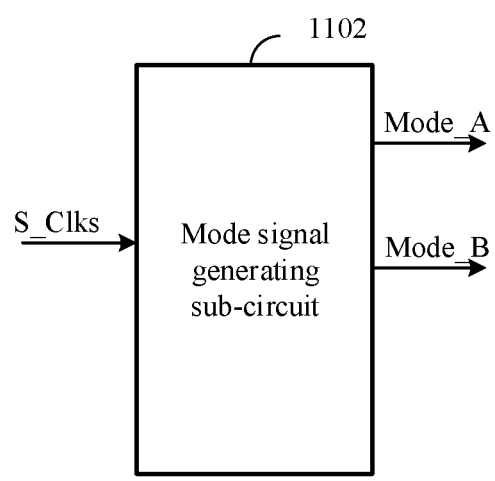

FIGS. 3A, 3B, and 3C illustrate block diagrams of a serial-to-parallel conversion circuit of a data transmission circuit according to the embodiments of the present disclosure, wherein FIG. 3A, FIG. 3B, and FIG. 3C each shows a part of the serial-to-parallel conversion circuit. This serial-parallel conversion circuit can be applied to the data transmission circuit of any of the above embodiments.

As shown in FIGS. 3A to 3C, the serial-parallel conversion circuit comprises a first selector S1, a second selector S2, N stages of cascaded shift register sub-circuits Rst1, Rst2, . . . , RstN, a mode selection signal generating sub-circuit 1101 and a mode signal generating sub-circuit 1102, wherein N is an integer greater than 1.

As shown in FIG. 3A, each stage of the shift register sub-circuits may generate a sampling clock signal. For example, the shift register sub-circuit at the first stage Rst1 generates a sampling clock signal S_Clk1, the shift register sub-circuit at the second stage Rst2 generates a sampling clock signal S_Clk2, and so forth, the shift register sub-circuit at N-th stage RstN generates a sampling clock signal S_ClkN. The N shift register sub-circuits Rst1, Rst2, . . . , RstN are connected in a cascade manner, so that a sampling clock signal generated by a shift register sub-circuit at n-th stage is shifted relative to a sampling clock signal generated by a shift register sub-circuit at (n−1)-th stage, wherein n is a positive integer and 1<n<N. For example, the sampling clock signal S_Clk2 is shifted by one clock cycle relative to the sampling clock signal S_Clk1, and the sampling clock signal S_Clk3 is shifted by one clock cycle relative to the sampling clock signal S_Clk2, and so on.

Each stage of the shift register sub-circuits can output a corresponding bit in the serial data Data_in based on the generated sampling clock signal. For example, the first-stage shift register sub-circuit Rst1 outputs the Nth bit of the N-bit serial data Data_in to the first output terminal D1 of the serial-parallel conversion circuit 110 based on the sampling clock signal S_Clk1, and the second-stage shift register sub-circuit Rst2 outputs the N−1th bit of the N-bit serial data Data_in to the second output terminal D21 of the serial-parallel conversion circuit 110 based on the sampling clock signal S_Clk2, and so on. The Nth stage shift register sub-circuit RstN outputs the first bit of the N-bit serial data Data_in to the N-th output terminal DN of the serial-parallel conversion circuit 110 based on the sampling clock signal S_Clk1.

As shown in FIG. 3A, the first input terminal of the first selector S1 receives an enable signal EN, the second input terminal receives the sampling clock signal S_ClkN from the shift register sub-circuit at Nth stage RstN, the control terminal receives the mode selection signal Mode_choose, and the output terminal is connected to the shift register sub-circuit at first-stage Rst1. The first selector S1 may select one of the enable signal EN and the sampling clock signal S_ClkN under the control of the mode selection signal Mode_choose to trigger the shift register sub-circuit at first-stage Rst1 to generate the sampling clock signal S_Clk1.

As shown in FIG. 3A, the first input terminal of the second selector S2 receives the sampling clock signal S_Clki generated by the shift register sub-circuit at i-th stage Rsti, the second input terminal receives the sampling clock signal S_ClkN from the shift register sub-circuit at N-th stage RstN, the control terminal receives the mode selection signal Mode_choose, and the output terminal is connected to the shift register sub-circuit at (i+1)-th stage Rst(i+1), wherein i is an integer and 1<i<N. The second selector S2 may select one of the sampling clock signal S_Clki and the sampling clock signal S_ClkN under the control of the mode selection signal Mode_choose to trigger the shift register sub-circuit at (i+1)-th stage Rst(i+1) to generate the sampling clock signal S_Clk(i+1).

As shown in FIG. 3B, the first input terminal of the mode selection signal generating sub-circuit 1101 receives the mode setting signal Mode_set, and the second input terminal receives one of the sampling clock signals generated by the N stages of cascaded shift register sub-circuits (shown as S_Clk). The sampling clock signal S_Clk may be any one of the sampling clock signals S_Clki to S_ClkN. The mode selection signal generating sub-circuit 1101 may generate a mode selection signal Mode_choose according to the mode setting signal Mode_set and the sampling clock signal S_Clk.

As shown in FIG. 3C, the input terminal of the mode signal generating sub-circuit 1102 receives at least a part of the sampling clock signals (shown as S_Clks) generated by the N stages of cascaded shift register sub-circuits. The sampling clock S_Clks may comprise several of the sampling clock signals S_Clki to S_ClkN.

The mode signal generating sub-circuit 1102 may generate a plurality of mode signals based on the sampling clock signal S_Clks, such as a first mode signal Mode_A and a second mode signal Mode_B.

Figure 4A:
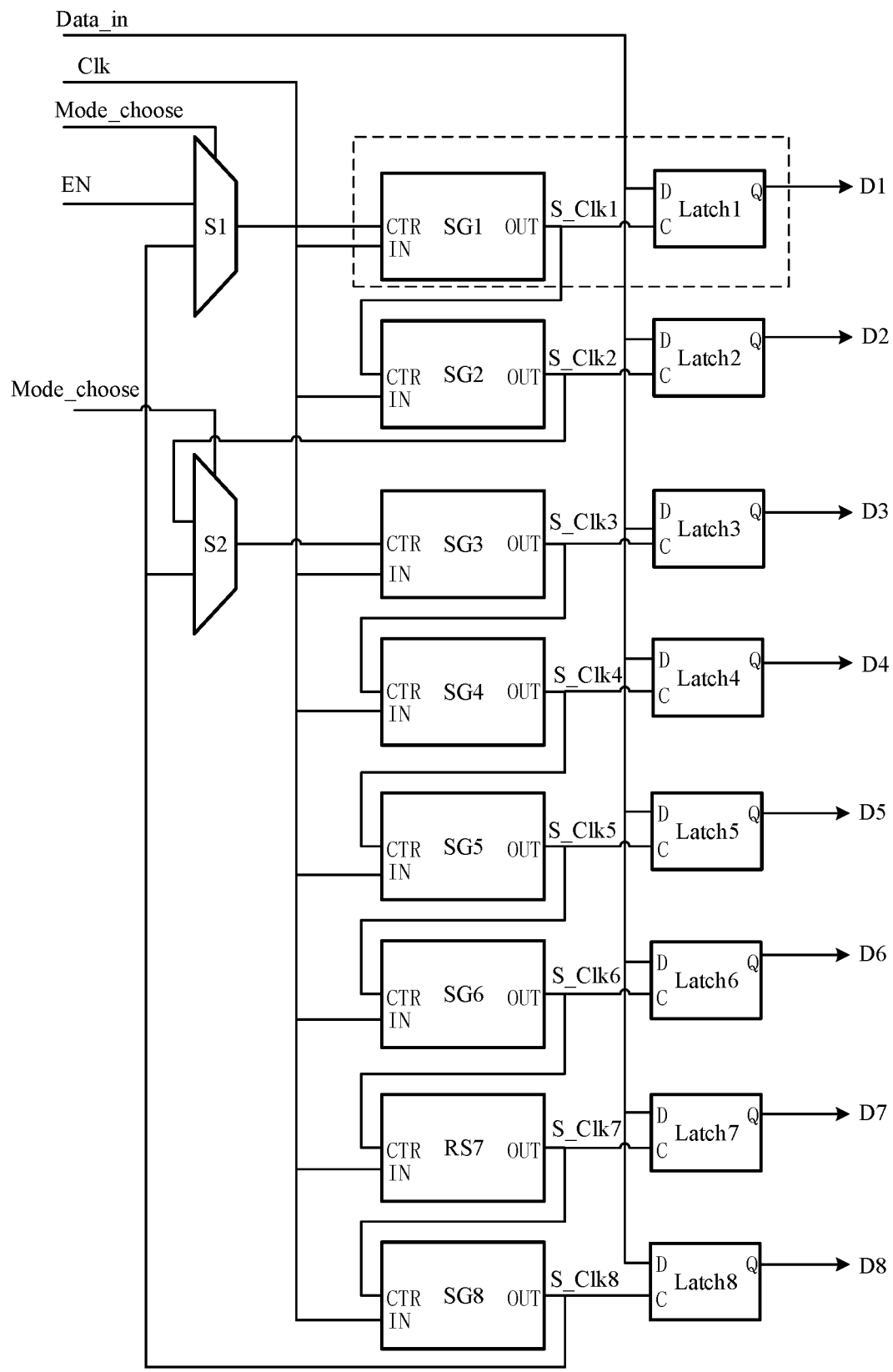
FIG. 4A, FIG. 4B, and FIG. 4C illustrate block diagrams of a serial-to-parallel conversion circuit of a data transmission circuit according to other embodiments of the present disclosure.
Figure 4B:
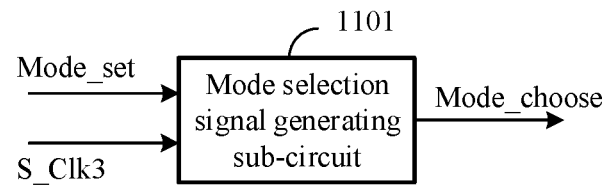
Figure 4C:
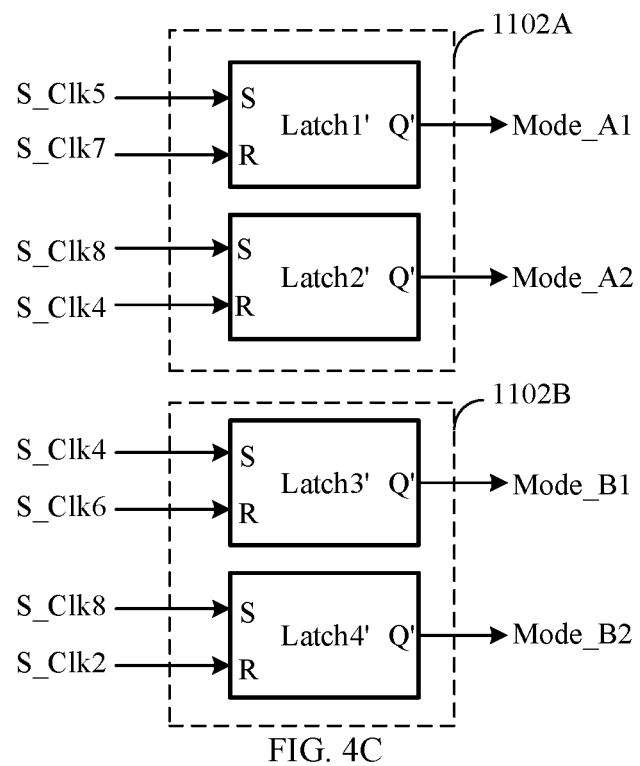

FIGS. 4A, 4B, and 4C illustrate block diagrams of a serial-to-parallel conversion circuit of a data transmission circuit according to another embodiment of the present disclosure, wherein FIG. 4A, FIG. 4B, and FIG. 4C each shows a part of the serial-to-parallel conversion circuit. This serial-parallel conversion circuit can be applied to the data transmission circuit of any of the above embodiments. The serial-to-parallel conversion circuits shown in FIGS. 4A to 4C are similar to the serial-to-parallel conversion circuits shown in FIGS. 3A to 3C. The descriptions above with reference to FIGS. 3A to 3C also apply to the serial-to-parallel conversion circuits shown in FIGS. 4A to 4C. The following will mainly describe the differences in detail.

As shown in FIGS. 4A to 4C, the serial-to-parallel conversion circuit comprises a first selector S1, a second selector S2, N stages of cascaded shift register sub-circuits, a mode selection signal generating sub-circuit 1101, and a mode signal generating sub-circuit 1102, wherein N is an integer greater than 1. In FIGS. 4A to 4C, N=8 is used as an example for illustration.

As shown in FIG. 4A, each stage of the shift register sub-circuit comprises a sampling clock generator and a D latch. For example, the shift register sub-circuit at first stage comprises a sampling clock generator SG1 and a D latch Latch1 (shown as the dashed box in FIG. 4A, only the shift register sub-circuit at first-stage is framed for simplicity), the shift register sub-circuit at second-stage comprises a sampling clock generator SG2 and a D latch Latch2, and so on, the shift register sub-circuit at eighth stage comprises a sampling clock generator SG8 and a D latch Latch8.

Each of the sampling clock generators SG1, SG2, . . . , SG8 has an input terminal IN, a control terminal CTR, and an output terminal OUT. The input terminal IN of each of the sampling clock generators SG1, SG2, . . . , SG8 receives a clock signal CLK. For example, in FIG. 4A, the control terminal CTR of the sampling clock generator SG8 of the shift register sub-circuit at eighth stage is connected to the output terminal OUT of the sampling clock generator SG7 of the shift register sub-circuit at seventh stage, and the control terminal CTR of the sampling clock generator SG7 of the shift register sub-circuit at seventh stage is connected to the output terminal OUT of the sampling clock generator SG6 of the shift register sub-circuit at sixth stage, and so on. Each of the sampling clock generators SG1, SG2, . . . , SG8 can sample the clock signal CLK at its input terminal IN according to the signal at its control terminal CTR to generate a sampling clock signal and output it at its output terminal OUT. Through the above cascaded manner of N stages, a sampling clock signal S_Clkn generated by a sampling clock generator SGn is shifted, for example by one clock cycle, relative to a sampling clock signal S_Clk(n−1) generated by a sampling clock generator SG(n−1).

Each of sampling clock generators is connected to a corresponding D latch. For example, the output terminal OUT of the sampling clock generator SG1 is connected to the control terminal C of the D latch Latch1, the output terminal OUT of the sampling clock generator SG2 is connected to the control terminal C of the D latch Latch2, and so on.

The input terminal IN of each of the D latches Latch1, Latch2, . . . , Latch8 receives the serial data Data_in. Each of D latchs Latch1, Latch2, . . . , Latch8 can latch the data at its input terminal D and output it at its output terminal Q under the control of the signal at its control terminal C, so that each of D latchs Latch1, Latch2, . . . , Latch8 outputs the corresponding one bit data of the serial data of 8 bits. For example, D latch Latch1 outputs the eighth bit, D latch Latch2 outputs the seventh bit, and so on, and D latch Latch8 outputs the first bit. The output terminal Q of each of D latchs serves as an output terminal of the serial-parallel conversion circuit. As shown in FIG. 4A, the output terminal Q of D latch Latch1 serves as the first output terminal D1 of the serial-parallel conversion circuit, the output terminal Q of the D latch Latch2 serves as the second output terminal D2 of the serial-parallel conversion circuit, and so on, so that the serial-parallel conversion circuit can output the parallel data of 8 bits through eight output terminals D1 to D8.

The first input terminal of the first selector S1 receives the enable signal EN, the second input terminal is connected to the output terminal OUT of the sampling clock generator SG8 to receive the sampling clock signal S_Clk8, the control terminal receives the mode selection signal Mode_choose, and the output terminal is connected to control terminal CTR of the sampling clock generator SG1. By this way, a loop is formed from the sampling clock generators SG1 to SG8, so that parallel data with the first bit width (8 bits) can be output.

The first input terminal of the second selector S2 is connected to the output terminal OUT of the sampling clock generator SG2 to receive the sampling clock signal S_Clk2, the second input terminal is connected to the output terminal OUT of the sampling clock signal generator SG8 to receive the sampling clock signal S_Clk8, the control terminal receives the mode selection signal Mode_choose, and the output terminal is connected to the control terminal CTR of the sampling clock generator SG3. By this way, a loop is formed from the sampling clock generators SG3 to SG8, so that parallel data with the second bit width (6 bits) can be output.

Although one second selector S2 connected between the sampling clock generators SG2 and SG3 is described as an example in the above embodiments, the embodiments of the present disclosure is not limited thereto, and the number and connection manner of the second selector S2 can be set as required. For example, two second selectors S2 can be set, one of which is connected as shown in FIG. 4A and the other is connected between the sampling clock generators SG7 and SG8 for parallel output in the 1-bit mode. For the 1-bit mode, other auxiliary circuits can be set to realize latch output of data, which are not repeated here.

As shown in FIG. 4B, the first input terminal of the mode selection signal generating sub-circuit 1101 receives the mode setting signal Mode_set, and the second input terminal is connected to the output terminal OUT of the sampling clock generator SG3 to receive the sampling clock signal S_Clk3. The mode selection signal generating sub-circuit 1101 may generate a mode selection signal Mode_choose according to the mode setting signal Mode_set and the sampling clock signal S_Clk3.

As shown in FIG. 4C, the mode signal generating sub-circuit 1102 may comprise a first mode signal generating sub-circuit 1102A and a second mode signal generating sub-circuit 1102B.

The first mode signal generating sub-circuit 1102A may output a first mode signal Mode_A comprising a first sub-signal Mode_A1 and a second sub-signal Mode_A2 based on at least a part of the sampling clock signals S_Clk1 to S_Clk8.

The second mode signal generating sub-circuit 1102B may output a second mode signal Mode_B comprising a first sub-signal Mode_B1 and a second sub-signal Mode_B2 based on at least a part of the sampling clock signals S_Clk1 to S_Clk8.

FIG. 4C shows the case of N=8 and i=2 as shown in FIG. 4A.

The first mode signal generating sub-circuit 1102A may comprise a first SR latch Latch1' and a second SR latch Latch2', and the second mode signal generating sub-circuit 1102B may comprise a third SR latch Latch3' and a fourth SR latch Latch4'.

The set terminal S of the first SR latch Latch1' is connected to the output terminal OUT of the sampling clock generator SG5 to receive the sampling clock signal S_Clk5, the reset terminal R of the first SR latch Latch1' is connected to the output terminal OUT of the sampling clock generator SG7 to receive the sampling clock signal S_Clk7, and the output terminal Q' of the first SR latch Latch1' outputs the first sub-signal Mode_A1 of the first mode signal Mode_A.

The set terminal S of the second SR latch Latch1' is connected to the output terminal OUT of the sampling clock generator SG8 to receive the sampling clock signal S_Clk8, the reset terminal R of the second SR latch Latch2' is connected to the output terminal OUT of the sampling clock generator SG4 to receive the sampling clock signal S_Clk4, and the output terminal Q' of the second SR latch Latch2' outputs the second sub-signal Mode_A2 of the first mode signal Mode_A.

The set terminal S of the third SR latch Latch3' is connected to the output terminal OUT of the sampling clock generator SG4 to receive the sampling clock signal S_Clk4, the reset terminal R of the third SR latch Latch3' is connected to the output terminal OUT of the sampling clock generator SG6 to receive the sampling clock signal S_Clk6, and the output terminal Q' of the third SR latch Latch3' outputs the first sub-signal Mode_B1 of the second mode signal Mode_B.

The set terminal S of the fourth SR latch Latch4' is connected to the output terminal OUT of the sampling clock generator SG8 to receive the sampling clock signal S_Clk8, the reset terminal R of the fourth SR latch Latch4' is connected to the output terminal OUT of the sampling clock generator SG2 to receive the sampling clock signal S_Clk2, and the output terminal Q' of the fourth SR latch Latch4' outputs the second sub-signal Mode_B2 of the second mode signal Mode_B.

In the above manner, in the case of N=8, the serial-parallel conversion circuit 110 outputs parallel data of 6 bits in the 3-bit mode and outputs parallel data of 8 bits in the 4-bit mode. However, the embodiments of the present disclosure are not limited to this. The value of N, the number and position of the second selectors can be selected according to different requirements. For example, in the case of N=16, i=4 can be used, and the second selector S2 is used to control the triggering of the sampling clock generator SG5, so that the serial-to-parallel conversion circuit 110 outputs parallel data of 12 bits in the 3-bit mode and outputs parallel data of 16 bits in the 4-bit mode.

Figure 5:
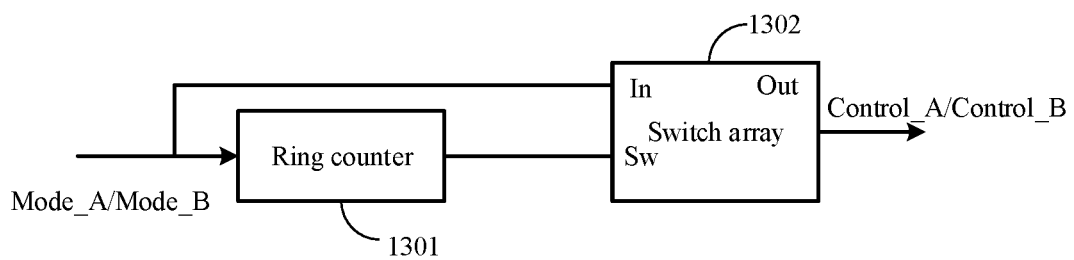
FIG. 5 illustrates a block diagram of a control circuit of a data transmission circuit according to the embodiments of the present disclosure.

FIG. 5 illustrates a block diagram of a control circuit in a data transmission circuit according to the embodiments of the present disclosure. The control circuit can be applied to the data transmission circuit of any of the above-mentioned embodiments. The above descriptions about FIG. 2A to FIG. 4C are also applicable to FIG. 5. As shown in FIG. 5, the control circuit 130 comprises a ring counter 1301 and a switch array 1302.

An input terminal of the ring counter 1301 is connected to the mode selection circuit 120 to receive the selected mode signal, such as the first mode signal Mode_A or the second mode signal Mode_B. An output terminal of the ring counter 1301 is connected to the control terminal Sw of the switch array 1302.

An input terminal In of the switch array 1302 is connected to the mode selection circuit 120 to receive the selected mode signal, such as Mode_A or Mode_B. The switch array 1302 may output a control signal for the selected mode at the output terminal Out according to the signals at its input terminal In and its control terminal Sw. For example, when the selected mode signal is the first mode signal Mode_A, the first mode signal Mode_A is counted by the ring counter 1301, and the counting result and the first mode signal Mode_A are logically processed by the switch array 1302 and thereby generating a control signal Control_A at the output terminal of the switch array 1302. Similarly, when the selected mode signal is the second mode signal Mode_B, a control signal Control_B is generated at the output terminal of the switch array 1302 by the processing of the ring counter 1301 and the switch array 1302.

For the case of N=8, the ring counter 1301 may be a modulo 2 ring counter, and the switch array 1302 may comprise two switches. However, the embodiments of the present disclosure are not limited thereto. The ring counter 1301 of other modulus and the switch array 1302 of other structures may be selected as required. For example, in the case of N=16, the ring counter 1301 may be a modulo 4 counter and the switch array 1302 may comprises four switches.

Figure 6:
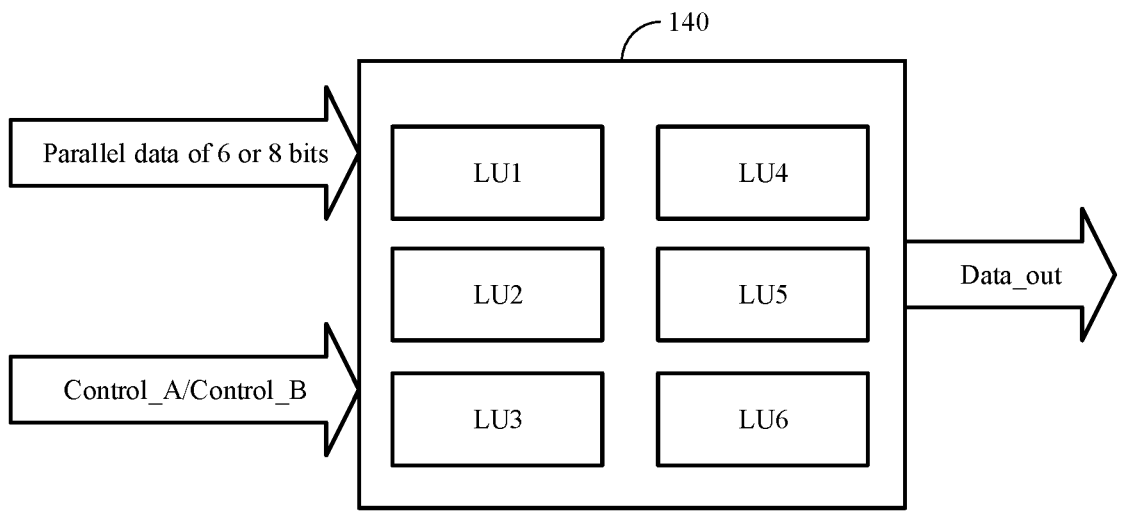
FIG. 6 illustrates a block diagram of a latch circuit of a data transmission circuit according to the embodiments of the present disclosure.

FIG. 6 shows a block diagram of a latch circuit in a data transmission circuit according to the embodiments of the present disclosure. The latch circuit can be applied to the data transmission circuit of any of the above embodiments, and the descriptions about FIG. 2A to FIG. 5 are also applicable to FIG. 6. In FIG. 6, illustration is also given by taking the case of N=8 as an example. As shown in FIG. 6, the latch circuit 140 comprises a plurality of latch units arranged in an array, for example, in the case of N=8, it comprises six latch units LU1, LU2, ..., LU6. Each latch unit is connected to a plurality of output terminals of the N output terminals of the serial-parallel conversion circuit. For example, in FIG. 6, each latch unit LU1, LU2, ..., LU6 is connected to a plurality of output terminals of the 8 output terminals D1-D8 of the serial-parallel conversion circuit 110. Each of the latch units LU1, LU2, ..., LU6 can latch and output a signal at one of the plurality of output terminals under the control of the control signal Control_A or Control_B from the control circuit 130.

For example, each latch unit may comprise a multi-path selector and a latch connected to the multi-path selector. The multi-path selector may select one signal at the plurality output terminals connected thereto under the control of a control signal Control_A or Control_B, and provide the selected signal to the latch for latching and output. In the case of N=8, the multi-path selector may be a 3-1 selector (1-in-3 selector, that is, selecting one of the 3 input paths).

For example, in the 3-bit mode, the serial-to-parallel conversion circuit 110 outputs parallel data of 6 bits through the output terminals D3 to D8. The latch unit LU1, LU2, ..., LU6 respectively selects the signal at D3, D4, D5, D6, D7, and D8 to latch and output under the control of the control signal Control_A. In the 4-bit mode, the serial-to-parallel conversion circuit 110 outputs parallel data of 8 bits through the output terminals D1 to D8, wherein D1, D2, D3, D5, D6, and D7 carry effective data R, G, B, and D4 and D8 carry dummy data. The latch unit LU1, LU2, ..., LU6 respectively selects the signal at D1, D2, D3, D5, D6, and D7 for latching and output under the control of the control signal Control_B.

In the example of FIG. 6, the latch units LU1, LU2, ..., LU6 are arranged in the form of a 3×2 array. The control signals Control_A and Control_B each has two sub-signals. The first sub-signal is provided to the first column of latch units, that is, LU1 to LU3, and the second sub-signal is provided to the second column of latch units, that is LU4 to LU6.

Although six latch units have been described above as an example, the embodiments of the present disclosure are not limited thereto, and the number and the arrangements of the latch units can be set as required. For example, for the case of N=16, in the 3-bit mode, the serial-to-parallel conversion circuit 110 outputs parallel data of 12 bits, and in the 4-bit mode, the serial-to-parallel conversion circuit 110 outputs parallel data of 16 bits. The latch circuit 140 may comprise 12 latch units arranged in an array of 3×4. The control signals Control_A and Control_B each has 4 sub-signals, which are respectively provided to each column of latch units.

Figure 7:
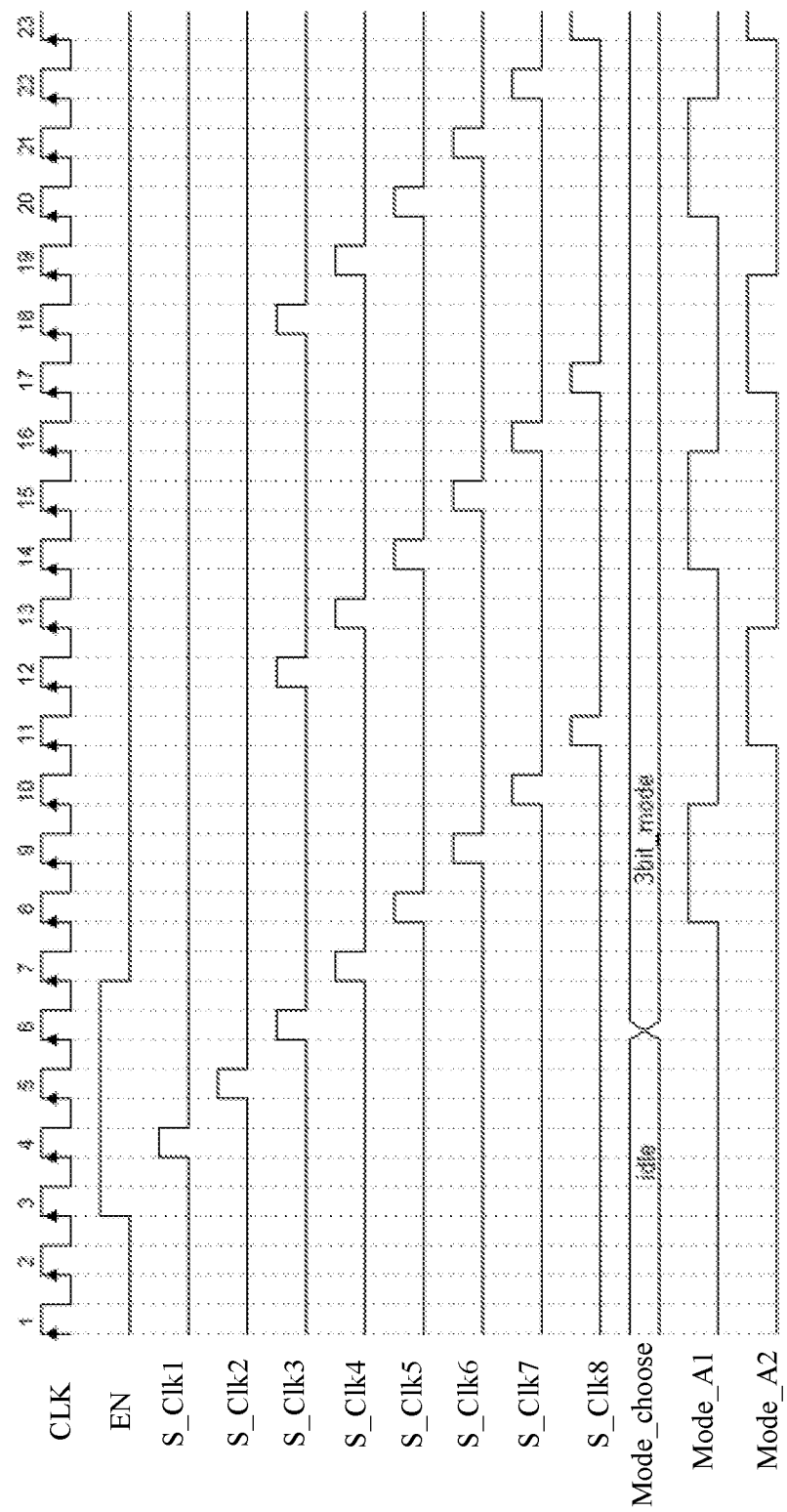
FIG. 7 illustrates a signal timing sequence diagram of a data transmission circuit in a 3-bit mode according to the embodiments of the present disclosure.

FIG. 7 shows a signal timing sequence diagram of a data transmission circuit in a 3-bit mode according to the embodiments of the present disclosure. The operational mode of the data output circuit provided in the 3-bit mode according to the embodiments of the present disclosure will be described in detail below with reference to the timing sequence diagram of FIG. 7.

The clock signal Clk shown in FIG. 7 is supplied to each of the sampling clock generators SG1 to SG8, and the mode selection signal generating sub-circuit 1101 of the serial-parallel conversion circuit 110 performs a combination logic operation on the mode setting signal Mode_Set and the sampling clock signal S_Clk3 to generate a mode selection signal Mode_Choose. The mode selection signal Mode_Choose can be a 2-bit signal which indicates four control states.

In the initial period, the mode selection signal Mode_choose is 00, indicating the initial (idle) state. Referring to FIG. 4A to FIG. 4C, the mode selection signal Mode_choose is 00, so that the first selector S1 selects the enable signal EN at its first input terminal and provides it to the sampling clock generator SG1. The enable signal EN causes the sampling clock generator SG1 to sample the clock signal CLK, thereby generating a sampling clock signal S_Clk1. The sampling clock signal S_Clk1 causes the sampling clock generator SG2 to sample the clock signal CLK, thereby generating a sampling clock signal S_Clk2 which is shifted by one clock cycle relative to the sampling clock signal S_Clk1. The mode selection signal Mode_choose of 00 also causes the second selector S2 to select the sampling clock signal S_Clk2 at its first input terminal and provide it to the sampling clock generator SG3.

After the sampling clock signal S_Clk2 is provided to the sampling clock generator SG3, the mode selection signal generating sub-circuit 1101 sets the mode selection signal to the operating state based on the mode set by the mode setting signal Mode_Set. In the example of FIG. 7, the mode set by the mode setting signal Mode_Set is a 3-bit mode, which causes the mode selection signal Mode_Choose to be set to 01, which indicates the operating state of the 3-bit mode (3 bit mode).

When the mode selection signal Mode_Choose is set to 01, the first selector S1 is turned off, and the first selector S1 does not select any signal at any input terminal. Setting the mode selection signal Mode_Choose to 01 causes the second selector S2 to select the sampling clock signal S_Clk8 at its second input terminal and provide it to the sampling clock generator SG3, so that a loop can be formed by the third sampling clock generator SG3 to the last sampling clock generator SG8 with the output signal at the last sampling clock generator SG8 being input to the third sampling clock generator SG3, which can cyclically output a total of 6 bits parallel data from D3 to D8.

For example, the sampling clock signal S_Clk2 is provided to the sampling clock generator SG3, so that the sampling clock generator SG3 generates the sampling clock signal S_Clk3. The sampling clock signal S_Clk3 is provided to the control terminal C of the D latch Latch3, so that the D latch Latch3 latchs one bit of the serial data Data_in at its input terminal D and outputs it at its output terminal Q, that is, outputs it at the output terminal D3 of the serial-parallel conversion circuit 110. The sampling clock signal S_Clk3 is provided to the sampling clock generator SG4, and the sampling clock generator SG4 generates the sampling clock signal S_Clk4, so that the D latch Latch4 latches another bit of the serial data Data_in and outputs it at D4, and so on. When the sampling clock signal is passed to the last stage of sampling clock generator, that is, the sampling clock signal S_Clk7 is provided to the sampling clock generator SG8, the sampling clock generator SG8 generates the sampling clock signal S_Clk8, so that the D latch Latch8 latchs one bit of the serial data Data_in and outputs it at D8. At this point, one cycle ends. The sampling clock signal S_Clk8 is provided to the second selector S2. At this time, since the mode selection signal Mode_Choose is 01, the second selector S2 provides the sampling clock signal S_Clk8 at its second input terminal to the sampling clock generator SG3, thereby the next cycle is started under the trigger of the sampling clock signal S_Clk8, and the next set of 6-bit data are output at D3 to D8.

As shown in FIG. 7, the mode signal generating sub-circuit 1102 of the serial-to-parallel conversion circuit 110 generates a first mode signal Mode_A for the 3-bit mode (first mode), and the first mode signal Mode_A comprises a first sub-signal Mode_A1 and a second sub-signal Mode_A2. Referring to FIG. 4C, when the sampling clock signal S_Clk5 is at high level, the set terminal S of the SR latch Latch1' is at high level and the reset terminal R of the SR latch Latch1' is at low level, thereby triggering the SR latch Latch1' to output the first sub-signal Mode_A1 with high level at its output terminal Q'. When the sampling clock signal S_Clk7 is at high level, the reset terminal of the SR latch Latch1' is at high level and the set terminal of the SR latch Latch1' is at low level, thereby rendering the SR latch Latch1' to reset the first sub-signal Mode_A1 at its output terminal Q' to low level. Similarly, the SR latch Latch2' generates a second sub-signal Mode_A2 as shown in FIG. 7 based on the sampling clock signals S_Clk8 and S_Clk4.

Referring to FIG. 5, after the first sub-signal Mode_A1 and the second sub-signal Mode_A2 of the first mode signal Mode_A pass through the control circuit 130, a control signal Control_A is obtained. For the case of N=8, the control signal Control_A has the same waveform as the first mode signal Mode_A, that is, it comprises two sub-signals Control_A1 and Control_A2 having the same waveforms as the first sub-signal Mode_A1 and the second sub-signal Mode_A2 as shown in FIG. 7. Referring to FIG. 7, the sub-signals Control_A1 and Control_A2 are periodic signals and have a period of 12 clock cycles. The sub-signal Control_A2 is shifted by 2 clock cycles relative to the sub-signal Control_A1.

Referring to FIG. 6, the sub-signal Control_A1 is supplied to the first column of latch units LU1 to LU3 in the latch circuit 140, and the sub-signal Control_A2 is supplied to the second column of latch units LU4 to LU6 in the latch circuit 140, thereby controlling the six latch units LU1 to LU6 of the latch circuit 140 to latch and output the parallel data of 6 bits at D3 to D8, respectively.

Figure 8:
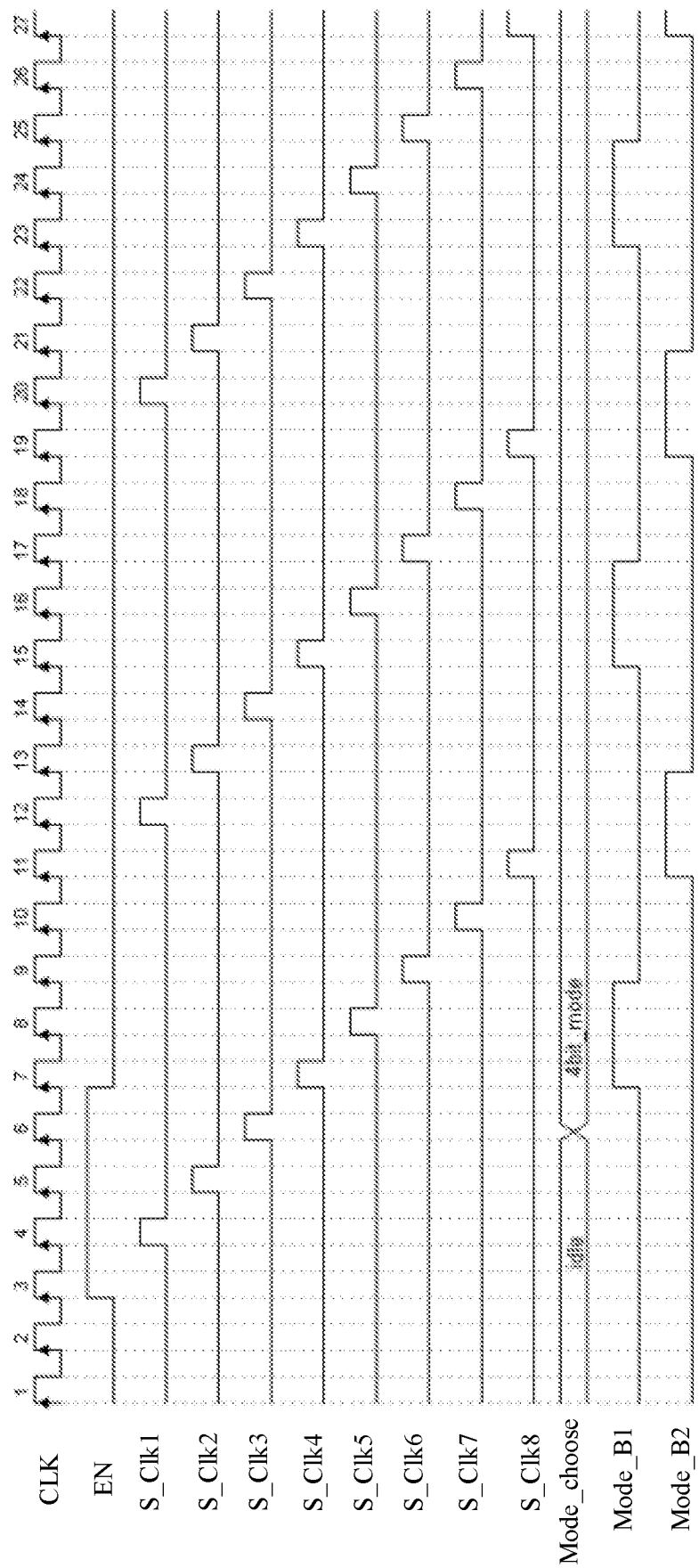
FIG. 8 illustrates a signal timing sequence diagram of a data transmission circuit in a 4-bit mode according to the embodiments of the present disclosure.

FIG. 8 illustrates a signal timing sequence diagram of a data transmission circuit in a 4-bit mode according to the embodiments of the present disclosure. The signal timing sequence diagram of FIG. 8 is similar to that of FIG. 7, except that FIG. 8 is for the 4-bit mode. For the sake of brevity, the differences between FIG. 8 and FIG. 7 will be mainly described in detail below.

As shown in FIG. 8, in the initial period, the mode selection signal Mode_choose is 00, which indicates an idle state. The first selector S1 selects the enable signal EN at its first input terminal and provides it to the sampling clock generator SG1. The enable signal EN causes the sampling clock generator SG1 to generate a sampling clock signal S_Clk1. The sampling clock signal S_Clk1 causes the sampling clock generator SG2 to generate a sampling clock signal S_Clk2 which is shifted by one clock cycle relative to the sampling clock signal S_Clk1. Mode_choose of 00 also causes the second selector S2 to select the sampling clock signal S_Clk2 at its first input terminal and provide it to the sampling clock generator SG3.

After the sampling clock signal S_Clk2 is supplied to the sampling clock generator SG3, the mode setting signal Mode_Set causes the mode selection signal generating sub-circuit 1101 to set the mode selection signal Mode_Choose to be 10 which indicates the 4-bit mode (4 bit mode).

The mode selection signal Mode_Choose of 10 causes the first selector S1 to select the sampling clock signal S_Clk8 at its second input terminal and provide it to the sampling clock generator SG1. The mode selection signal Mode_Choose of 10 also causes the second selector S2 to still select the sampling clock signal S_Clk2 at its first input terminal and provide it to the sampling clock generator SG3. In this way, a loop is formed by the sampling clock generator SG1 at the first stage to the sampling clock generator SG8 at the last stage with the output signal at the sampling clock generator SG8 being input to the sampling clock generator SG1, which can cyclically output a total of 8 bits of parallel data from D1 to D8.

For example, the sampling clock signal S_Clk1 generated by the sampling clock generator SG1 causes the D latch Latch1 to latch one bit of serial data Data_in and output it at D1; the sampling clock signal S_Clk1 causes the sampling clock generator SG2 to generate the sampling clock signal S_Clk2, so that D latch Latch2 latches another bit of serial data Data_in and outputs it at the output terminal D2 of the serial-parallel conversion circuit, and so on. The sampling clock signal S_Clk7 provided to the sampling clock generator SG8 causes the sampling clock generator SG8 to generate a sampling clock signal S_Clk8, so that the D latch Latch8 latches one bit of the serial data Data_in and outputs it at D8. At this point, one cycle ends. The sampling clock signal S_Clk8 is selected by the first selector S1 and provided to the sampling clock generator SG1, thereby triggering to start the next cycle and output the next set of 8-bit data at D1 to D8.

The mode signal generating sub-circuit 1102 of the serial-to-parallel conversion circuit 110 generates a second mode signal Mode_B for the 4-bit mode (second mode), which comprises a first sub-signal Mode_B1 and a second sub-signal Mode_B2. As shown in FIG. 4C, when the sampling clock signal S_Clk4 is at high level, the set terminal S of the SR latch Latch3' is at high level and the reset terminal R of the SR latch Latch3' is at low level, thereby triggering the SR latch Latch3' to output the first sub-signal Mode_B1 with high level at its output terminal Q'. When the sampling clock signal S_Clk6 is at high level, the reset terminal of the SR latch Latch3' is at high level and the set terminal of the SR latch Latch3' is at low level, thereby triggering the SR latch Latch3' to reset the first sub-signal Mode_B1 at its output terminal Q' to a low level. Similarly, the SR latch Latch4' generates a second sub-signal Mode_B2 as shown in FIG. 8 based on the sampling clock signals S_Clk8 and S_Clk2.

Referring to FIG. 5, after the first sub-signal Mode_B1 and the second sub-signal Mode_B2 of the second mode signal Mode_B pass through the control circuit 130, a control signal Control_B is obtained. For the case of N=8, the control signal Control_B has the same waveform as the first mode signal Mode_B, that is, it comprises two sub-signals Control_B1 and Control_B2 with the same waveforms as the first sub-signal Mode_B1 and the second sub-signal Mode_B2 as shown in FIG. 8. Referring to FIG. 8, the sub-signals Control_B1 and Control_B2 are periodic signals and have a period of 16 clock cycles. The sub-signal Control_B2 is shifted by 4 clock cycles relative to the sub-signal Control_B1.

Referring to FIG. 6, the sub-signal Control_B1 is supplied to the first column of latch units LU1 to LU3 in the latch circuit 140, and the sub-signal Control_B2 is supplied to the second column of latch units LU4 to LU6 in the latch circuit 140, thereby controlling the six latch units LU1 to LU6 of the latch circuit 140 to select six output terminals among the output terminals of D1 to D8 for latching and outputting the data at the selected terminals.

Although the waveforms of the mode signal and the control signal are described above by taking N=8 as an example, the embodiments of the present disclosure are not limited thereto. For the case where N is another value, the mode signals and control signals of other waveforms may be adopted. For example, when N=16, the control circuit generates a control signal of 4 bits based on the mode signal of 2 bits. Correspondingly, twelve latch units arranged in an array of 3×4 are provided in the latch circuit 140, and four parallel sub-signals of the control signal are respectively provided to the four column of latch units. In this case, the waveform of the control signal is determined by a logical combination of the count signal of the ring counter and the mode signal.

Figure 9:
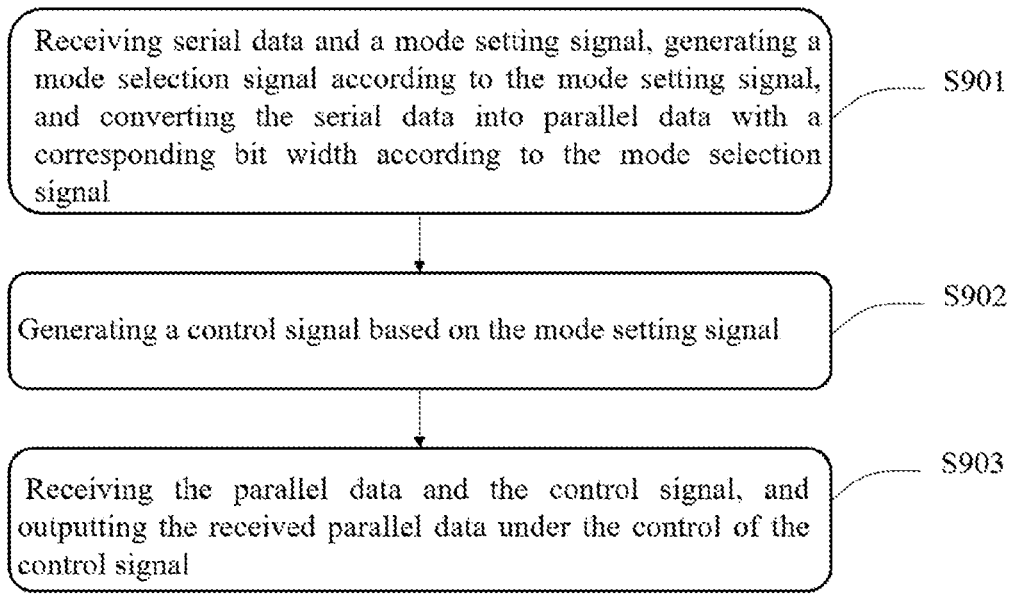
FIG. 9 illustrates a flowchart of a data transmission method according to the embodiments of the present disclosure.

FIG. 9 shows a flowchart of a data transmission method 900 according to the embodiments of the present disclosure. The data transmission method 900 can be performed in the data transmission circuit of any of the above embodiments.

As shown in FIG. 9, in step S901, serial data and a mode setting signal are received, a mode selection signal is generated according to the mode setting signal, and the serial data is converted into parallel data of a corresponding bit width according to the mode selection signal.

In step S902, a control signal is generated based on the mode setting signal.

In step S903, the parallel data and the control signal are received, and the received parallel data is output under the control of the control signal. Although the steps are described above in a specific order, the embodiments of the present disclosure are not limited thereto, and the steps may be performed in other orders as needed.

Figure 10:
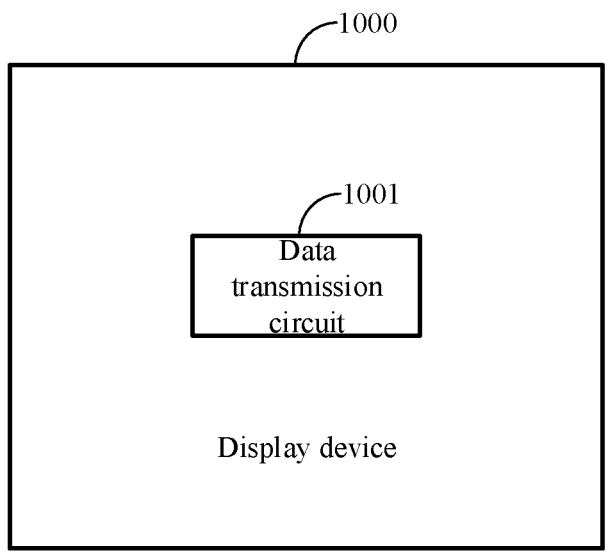
FIG. 10 illustrates a block diagram of a display device according to the embodiments of the present disclosure.

FIG. 10 illustrates a block diagram of a display device 1000 according to the embodiments of the present disclosure. As shown in FIG. 10, the display device 1000 comprises a data transmission circuit 1001 which may be implemented by the data transmission circuit of any of the above embodiments. The output data Data_out of the data transmission circuit 1001 may be provided to a corresponding sub-pixel on the display panel of the display device 1000 to drive it for display. Examples of the display device 1000 comprise, but are not limited to, a mobile phone, a television, a tablet computer, a personal computer (PC), and other devices having a display function.

The embodiments of the present disclosure enable the serial-to-parallel conversion circuit to output parallel data of different bits according to different modes, and select the mode signal at the front end of the control circuit accordingly, so that there is no need to set a separate control circuit for each mode signal thereby simplifying the circuit structure.

In the embodiments of the present disclosure, through the setting of a second selector, a loop can be formed from the shift register sub-circuit at any stage to the shift register sub-circuit at the last stage as required, so that parallel output of different bits can be implemented as required. Moreover, compared with the conventional technology, there is no need to provide a special circuit module to generate a cycle start signal for starting a sampling cycle.

In the embodiments of the present disclosure, the structure of other circuit modules in the data transmission circuit can be further simplified by causing the serial-to-parallel conversion circuit to output parallel data of different bits according to different modes. For example, in the conventional technology, since the serial-to-parallel conversion circuit does not distinguish the mode of data, the latch circuit is required to have stronger capability on selection switching. For example, in the case of N=8, each of latch units in the latch circuit uses a 6-1 selector (1-in-6 selector) to select the output terminal of the parallel data. In contrast, in the embodiments of the present disclosure, in the case of N=8, the number of output terminals connected to each latch unit for outputting parallel data is reduced, and the selection of the output terminals of the parallel data can be implemented by using a 3-1 selector (1-in-3 selector). In addition, the embodiments of the present disclosure require a simpler control circuit to generate the control signals due to a lower requirement for the control signal selection capability. For example, in the case of N=8, the embodiments of the present disclosure may use a modulo 2 ring counters and 4 switches to generate the control signal, while the conventional technology needs to use model 4 and model 6 ring counters and 8 or more switches to generate the control signal.

Those skilled in the art can understand that the embodiments described above are all exemplary, and those skilled in the art can improve them. The structures described in various embodiments can be freely combined as long as there is no conflict in structure or principle.

After a detailed description of the preferred embodiments of the present disclosure, those skilled in the art will clearly understand that various changes and modifications may be made without departing from the scope and spirit of the appended claims, and the present disclosure is not subject to the implementation of the exemplary embodiments mentioned in the description.

The present application claims the benefit of priority right of Chinese patent application with the application No. of 201911189318.8, filed on Nov. 27, 2019 in China. For all purposes, the entire disclosure of the aforementioned application is incorporated herein by reference as a part of the disclosure of this application.

What is claimed is:

1. A data transmission circuit, comprising:
    a serial-to-parallel conversion circuit configured to receive serial data and a mode setting signal, generate a mode selection signal according to the mode setting signal, and convert the serial data into parallel data with a corresponding bit width according to the mode selection signal;
    a control signal generating circuit configured to generate a control signal based on the mode setting signal; and
    a latch circuit connected to the serial-to-parallel conversion circuit and the control signal generating circuit, and being configured to receive the parallel data from the serial-to-parallel conversion circuit and the control signal from the control signal generating circuit, and latch and output the received parallel data under the control of the control signal.

2. The data transmission circuit according to claim 1, wherein the serial-to-parallel conversion circuit is further configured to generate a plurality of mode signals respectively for a plurality of modes, wherein the mode signals are used to generate the control signal.

3. The data transmission circuit according to claim 2, wherein the control signal generating circuit comprises:
a mode selection circuit connected to the serial-to-parallel conversion circuit, and being configured to select one from the plurality of mode signals based on the mode setting signal;
a control circuit connected to the mode selection circuit, and being configured to convert the selected mode signal into the control signal.

4. The data transmission circuit according to claim 3, wherein the plurality of modes comprise a first mode and a second mode, and the plurality of mode signals comprise a first mode signal for the first mode and a second mode signal for the second mode, the serial-to-parallel conversion circuit is configured to set the first mode to be a data transmission mode according to the mode setting signal, and convert the serial data into parallel data with a first bit width; or set the second mode to be a data transmission mode according to the mode setting signal, and convert the serial data into parallel data with a second bit width, wherein the first bit width corresponds to the first mode, the second bit width corresponds to the second mode, and the first bit width is different from the second bit width.

5. The data transmission circuit according to claim 4, wherein the serial-to-parallel conversion circuit comprises:
N stages of cascaded shift register sub-circuits, wherein each stage of shift register sub-circuit is configured to generate a sampling clock signal and output a corresponding bit in the serial data based on the generated sampling clock signal, wherein the sampling clock signal generated by the shift register sub-circuit at n-th stage is shifted relative to the sampling clock signal generated by the shift register sub-circuit at (n−1)-th stage, wherein n and N are positive integers, and 1<n<N;
a first selector configured to select one of an enable signal and a sampling clock signal from the shift register sub-circuit at N-th stage under the control of the mode selection signal to trigger the shift register sub-circuit at first stage to generate a sampling clock signal;
a second selector configured to select one of a sampling clock signal from the shift register sub-circuit at i-th stage and a sampling clock signal from the shift register sub-circuit at N-th stage under the control of the mode selection signal to trigger the shift register sub-circuit at (i+1)-th stage to generate a sampling clock signal, wherein i is an integer and 1<i<N;
a mode selection signal generating sub-circuit configured to generate the mode selection signal according to the mode setting signal and one of sampling clock signals generated by the N stages of cascaded shift register sub-circuits; and
a mode signal generating sub-circuit configured to generate the plurality of mode signals based on at least a part of the sampling clock signals generated by the N stages of cascaded shift register sub-circuits.

6. The data transmission circuit according to claim 5, wherein each stage of the shift register sub-circuits comprises:

a sampling clock generator having an input terminal for receiving a clock signal, and being configured to sample the clock signal at the input terminal of the sampling clock generator to produce a sampling clock signal according to a signal at the control terminal of the sampling clock generator and output the sampling clock signal at an output terminal of the sampling clock generator; and
a D latch having an input terminal for receiving the serial data, an control terminal connected to the output terminal of the sampling clock generator, and an output terminal serving as one of the N output terminals of the serial-parallel conversion circuit, wherein
the control terminal of the sampling clock generator of the shift register sub-circuit at n-th stage is connected to the output terminal of the sampling clock generator of the shift register sub-circuit at (n−1)-th stage, and the control terminal of the sampling clock generator of the shift register sub-circuit at first stage is connected to the output terminal of the first selector, and the control terminal of the sampling clock generator of the shift register sub-circuit at i-th stage is connected to the output terminal of the second selector.

7. The data transmission circuit according to claim 5, wherein the mode signal generating sub-circuit comprises:
a first mode signal generating sub-circuit configured to output a first mode signal comprising a first sub-signal and a second sub-signal based on at least a part of the sampling clock signals generated by the N stages of cascaded shift register sub-circuits; and
a second mode signal generating sub-circuit configured to output a second mode signal comprising a first sub-signal and a second sub-signal based on at least a part of the sampling clock signals generated by the N stages of cascaded shift register sub-circuits.

8. The data transmission circuit according to claim 7, wherein N=8 and i=2,
the first mode signal generating sub-circuit comprises:
a first SR latch, wherein a set terminal of the first SR latch receives a sampling clock signal generated by the shift register sub-circuit at fifth stage, a reset terminal of the first SR latch receives a sampling clock signal generated by the shift register sub-circuit at seventh stage, an output terminal of the first SR latch outputs the first sub-signal of the first mode signal;
a second SR latch, wherein a set terminal of the second SR latch receives a sampling clock signal generated by the shift register sub-circuit at eighth stage, a reset terminal of the second SR latch receives a sampling clock signal generated by the shift register sub-circuit at fourth stage, an output terminal of the second SR latch outputs the second sub-signal of the first mode signal, and
the second mode signal generating sub-circuit comprises:
a third SR latch, wherein a set terminal of the third SR latch receives the sampling clock signal generated by the shift register sub-circuit at fourth stage, a reset terminal of the third SR latch receives a sampling clock signal generated by the shift register sub-circuit at sixth stage, an output terminal of the third SR latch outputs the first sub-signal of the second mode signal; and
a fourth SR latch, wherein a set terminal of the fourth SR latch receives the sampling clock signal generated by the shift register sub-circuit at eighth stage, and a reset terminal of the fourth SR latch receives a sampling clock signal generated by the shift register sub-circuit at second stage, an output terminal of the fourth SR latch outputs the second sub-signal of the second mode signal.

9. The data transmission circuit according to claim 4, wherein the mode selection circuit comprises a third selector, a first input terminal of the third selector receives the first mode signal, and a second input terminal of the third selector receives the second mode signal, a control terminal of the third selector receives the mode setting signal, and an output terminal of the third selector is connected to the control circuit.

10. The data transmission circuit according to claim 3, wherein the control circuit comprises:
    a ring counter having an input terminal connected to the mode selection circuit to receive the selected mode signal; and
    a switch array having an input terminal connected to the mode selection circuit to receive the selected mode signal, a control terminal connected to the output terminal of the ring counter, and an output terminal configured to output the control signal.

11. The data transmission circuit according to claim 1, wherein the latch circuit comprises a plurality of latch units arranged in an array, wherein each of latch units is connected to one of N output terminals of the serial-to-parallel conversion circuit, and is configured to latch and output the signal at one of the plurality of output terminals under the control of the control signal, where N is an integer greater than 1.

12. A display device comprising the data transmission circuit according to claim 1.

13. A data transmission method for the data transmission circuit according to claim 1, comprising:
    receiving the serial data and the mode setting signal, generating the mode selection signal according to the mode setting signal, and converting the serial data into parallel data with a corresponding bit width according to the mode selection signal;
    generating the control signal based on the mode setting signal; and
    receiving the parallel data and the control signal, and outputting the received parallel data under the control of the control signal.

14. The data transmission method according to claim 13, further comprising: generating a plurality of mode signals respectively for a plurality of modes, wherein the mode signals are used to generate the control signal.

15. The data transmission method according to claim 14, wherein the generating a control signal based on the mode setting signal comprises:
    selecting one from the plurality of mode signals based on the mode setting signal;
    converting the selected mode signal into the control signal.

* * * * *